US008595601B2

(12) United States Patent
Kim et al.

(10) Patent No.: US 8,595,601 B2
(45) Date of Patent: Nov. 26, 2013

(54) METHODS OF PERFORMING ERROR DETECTION/CORRECTION IN NONVOLATILE MEMORY DEVICES

(75) Inventors: Yong June Kim, Seoul (KR); Junjin Kong, Yongin-si (KR); KyoungLae Cho, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 344 days.

(21) Appl. No.: 13/011,279

(22) Filed: Jan. 21, 2011

(65) Prior Publication Data

US 2011/0209031 A1    Aug. 25, 2011

(30) Foreign Application Priority Data

Feb. 25, 2010  (KR) .................. 10-2010-0017293

(51) Int. Cl.
*H03M 13/00* (2006.01)
(52) U.S. Cl.
USPC .............................................. 714/780
(58) Field of Classification Search
USPC ............. 714/746, 763–764, 780; 365/189.05, 365/200–201
See application file for complete search history.

(56) References Cited

U.S. PATENT DOCUMENTS 5,517,450 A * 5/1996 Ohsawa ..................... 365/200
6,587,294 B1 7/2003 Ushio et al.
6,879,504 B1 4/2005 Lien et al.
6,882,592 B2 * 4/2005 Noguchi et al. .......... 365/230.03
8,060,806 B2 * 11/2011 Shalvi et al. ................. 714/763
8,151,163 B2 * 4/2012 Shalvi et al. ................. 714/758

FOREIGN PATENT DOCUMENTS

| JP | 06-203596 | 7/1994 |
| JP | 07-152503 | 6/1995 |
| JP | 2001-244825 | 9/2001 |
| KR | 1020100033195 A | 3/2010 |
| KR | 1020100104623 | 9/2010 |

\* cited by examiner

*Primary Examiner* — Shelly A Chase
(74) *Attorney, Agent, or Firm* — Myers Bigel Sibley & Sajovec, P.A.

(57) ABSTRACT

Methods of operating nonvolatile memory devices include testing a plurality of strings of nonvolatile memory cells in the memory device to identify at least one weak string therein having a higher probability of yielding erroneous read data error relative to other ones of the plurality of strings. An identity of the at least one weak string may be stored as weak column information. This weak column information may be used to facilitate error detection and correction operations. In particular, an error correction operation may be performed on a first plurality of bits of data read from the plurality of strings using an algorithm that modifies a weighting of the reliability of one or more data bits in the first plurality of bits of data based on the weak column information. More specifically, an algorithm may be used that interprets a bit of data read from the at least one weak string as having a relatively reduced reliability relative to other ones of the first plurality of data bits.

23 Claims, 16 Drawing Sheets

METHODS OF PERFORMING ERROR DETECTION/CORRECTION IN NONVOLATILE MEMORY DEVICES

REFERENCE TO PRIORITY APPLICATION

This application claims priority to Korean Patent Application No. 10-2010-0017293, filed Feb. 25, 2010, the contents of which are hereby incorporated herein by reference.

FIELD

The present disclosure herein relates to semiconductor memory devices, and more particularly, to a memory system including a nonvolatile memory device and a data processing method for increasing the reliability of data read from a nonvolatile memory device.

BACKGROUND

Semiconductor memory devices are generally classified into volatile memory devices and nonvolatile memory devices. The volatile memory devices have a high read/write speed but lose data stored therein when power supply thereto is interrupted. On the other hand, the nonvolatile memory devices retain data stored therein even when power supply thereto is interrupted. Therefore, the nonvolatile memory devices are used to store data that must be retained regardless of power supply. Examples of the nonvolatile memory devices include Mask Read-Only Memory (MROM) devices, Programmable Read-Only Memory (PROM) devices, Erasable Programmable Read-Only Memory (EPROM) devices, and Electrically Erasable Programmable Read-Only Memory (EEPROM) devices.

Recently, a demand for higher capacity semiconductor memory devices is increasing with a sudden change in the mobile trend. Accordingly, the number of bits stored in one memory cell is increasing. For example, Multi-Level Cell (MLC) memory devices storing multi-bits in one memory cell are being universalized. Also, the number of memory cells integrated in the same area is increasing. However, the reliability of stored data decreases with an increase in the integration density and an increase in the number of bits stored in an MLC. What is therefore required is a technology for increasing the reliability of stored data while satisfying a demand for the massiveness of memory devices.

SUMMARY

Methods of operating nonvolatile memory devices according to embodiments of the invention include testing a plurality of strings of nonvolatile memory cells in the memory device to identify at least one weak string therein having a higher probability of yielding erroneous read data error relative to other ones of the plurality of strings. An identity of the at least one weak string may be stored as weak column information. This weak column information may be used to facilitate error detection and correction operations. In particular, an error correction operation may be performed on a first plurality of bits of data read from the plurality of strings using an algorithm that modifies a weighting of the reliability of one or more data bits in the first plurality of bits of data based on the weak column information. More specifically, an algorithm may be used that interprets a bit of data read from the at least one weak string as having a relatively reduced reliability relative to other ones of the first plurality of data bits. A probability of error associated with each of the first plurality of bits of data may also be calculated. For example, a probability of error associated with each of the first plurality of bits of data may be calculated by determining a log-likelihood ratio (LLR) for each of the first plurality of bits of data. In addition, error detection and correction may be improved by switching a value of a bit of data read from the at least one weak string in advance of performing an error correction operation on the first plurality of bits of data.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF THE EMBODIMENTS

Figure 1:
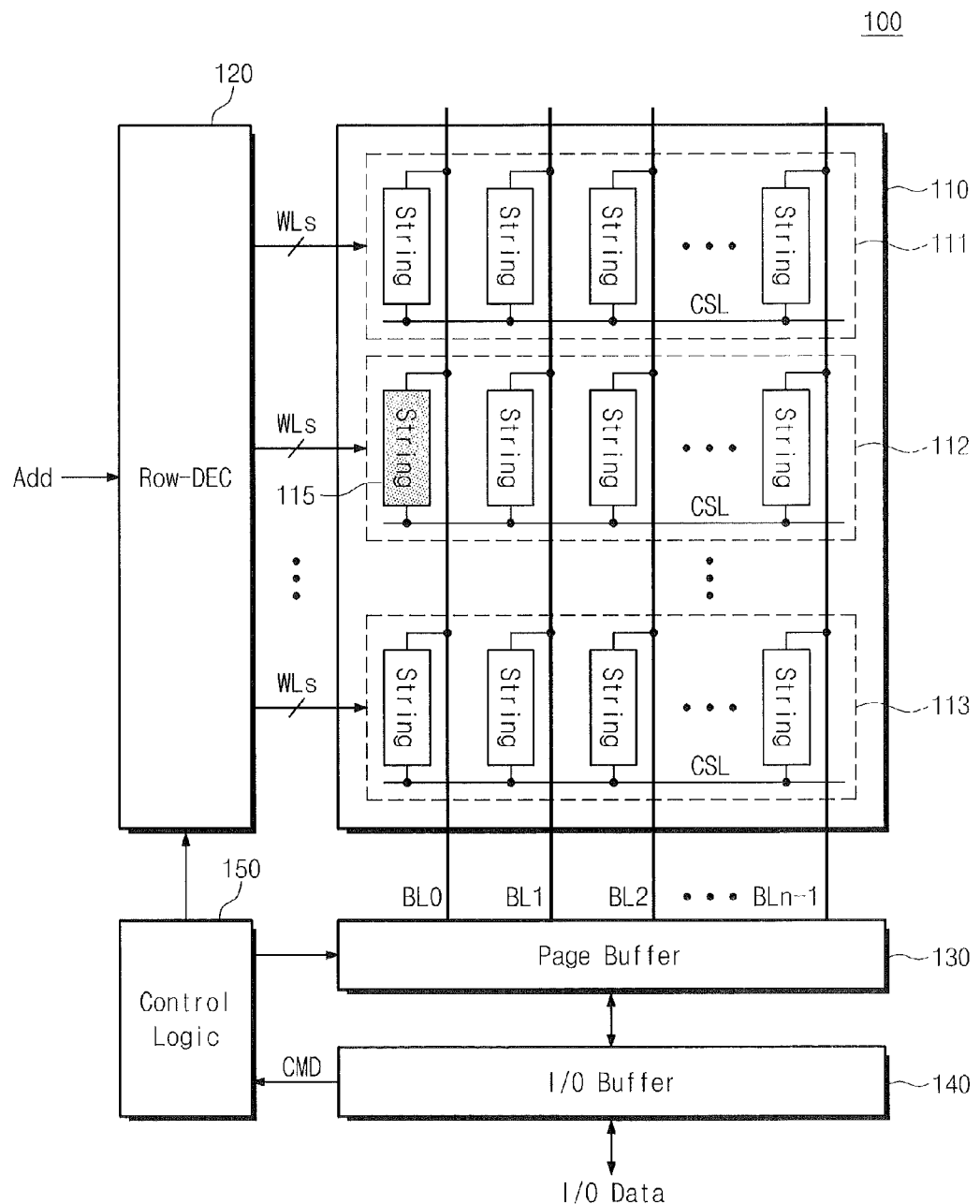
FIG. 1 is a block diagram of a nonvolatile memory device according to an exemplary embodiment of the inventive concept.

Preferred embodiments of the inventive concept will be described below in more detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

It should be construed that foregoing general illustrations and following detailed descriptions are exemplified and an additional explanation of claimed inventive concept is provided. Reference numerals are indicated in detail in preferred embodiments of the inventive concept, and their examples are represented in reference drawings. In every possible case, like reference numerals are used for referring to the same or similar elements in the description and drawings.

Below, a nonvolatile memory device is used as an example of a semiconductor memory device to illustrate the characteristics and functions of the inventive concept. However, those skilled in the art can easily understand other advantages and performances of the inventive concept according to the descriptions. The inventive concept may be embodied or applied through other embodiments. Besides, the detailed description may be amended or modified according to viewpoints and applications without departing from the spirit, scope and other objects of the inventive concept. Also, the term 'erasure' used herein means a third logic state for indicating a bit that is difficult to define as a logic '0' or a logic '1', rather than meaning an operation of erasing data of a memory cell.

FIG. 1 is a block diagram of a nonvolatile memory device according to an exemplary embodiment of the inventive concept.

Referring to FIG. 1, a nonvolatile memory device 100 according to an exemplary embodiment of the inventive concept includes a cell array 110, a row decoder 120, a page buffer 130, an input/output (I/O) buffer 140, and a control logic 150.

The cell array 110 includes a plurality of memory cells connected to bit lines BL0~BLn-1 and word lines WLs. The cell array 110 includes a plurality of memory blocks 111, 112, . . . , 113. Each of the memory blocks 111, 112, 113 may correspond to an erase unit. The memory blocks include a plurality of cell strings. The cell string is the unit of memory cells connected in series. The memory cells included in any one of the cell strings are selected by the same selection transistor.

The cell strings of the memory block 111 are connected to a common source line CSL. The respective strings are connected to different bit lines BL0~BLn-1. The structures of the memory blocks 112 and 113 may be equal to the structure of the memory block 111. If a defect occurs in a cell string 115 of the memory block 112, it also affects the other cell strings connected to the bit line BL0. Typically, such a defective bit line BL0 is replaced with a redundant bit line.

Also, the electrical characteristics of cell strings change according to the patterns of data programmed in memory cells, without a circuit defect. For example, it is assumed that all the memory cells of the cell string 115 are programmed to a state corresponding to the highest threshold voltage (e.g., P3 in a 2-bit MLC). Then, when the memory block 112 is selected and data are read therefrom, the data of a column corresponding to the cell string 115 have lower reliability than those of the other cell strings. This is called back pattern dependency.

The memory cells degrade not only by the back pattern dependency but also with an increase in program/erase (P/E) cycle. Thus, the reliability of data of the string with a plurality of degraded memory cells is relatively low.

The defect occurring in any cell string may affect the other cell strings sharing a bit line. Also, applying a column redundancy to all the bit lines connected to the defective cell string may cause a cost increase. Also, if a column redundancy region for replacing a defective column is insufficient, it must be treated as defective. Hereinafter, a column containing the defective or degraded memory cell, or a column with back pattern dependency will be referred to as a weak column (WC).

Typically, the row decoder 120 selects a word line in response to an address. The row decoder 120 transfers various word line (WL) voltages, received from a voltage generator (not illustrated), to the word lines. In a program operation, under the control of the control logic 150, the row decoder 120 transfers a program voltage Vpgm of about 15~20 V and a verify voltage Vvfy to a selected WL and transfers a pass voltage Vpass to an unselected word line. In a read operation, the row decoder 120 provides a selected read voltage Vrd to a selected WL and provides an unselected read voltage Vread to unselected word lines.

The page buffer 130 operates as a write driver or a sense amplifier according to an operation mode. For example, the page buffer 130 operates a sense amplifier in a read operation and operates a write driver in a program operation. Under the control of the control logic 150, in a read operation, the page buffer 130 latches data sensed from the selected memory cells and transfers the same to the I/O buffer 140.

The I/O buffer 140 temporarily stores an address and program data inputted through an I/O pin. The I/O buffer 140 transfers the stored address to an address buffer (not illustrated), transfers the program data to the page buffer 130, and transfers a command CMD to the control logic 150 including a command register (not illustrated). In a read operation, the read data provided from the page buffer 130 are outputted through the I/O buffer 140 to an external device (i.e., a memory controller).

According to an external command CMD, the control logic 150 controls the page buffer 130 and the row decoder 120 for a program/read/erase operation.

In the nonvolatile memory device 100, a technology is necessary to overcome the problem of a defective cell string, a cell string with degraded memory cells, or a weak column with back pattern dependency. An exemplary embodiment of the inventive concept provides a memory controller that can overcome the weak column problem. The memory controller may correct an error by a soft decision scheme with reference to the weak column.

Figure 2:
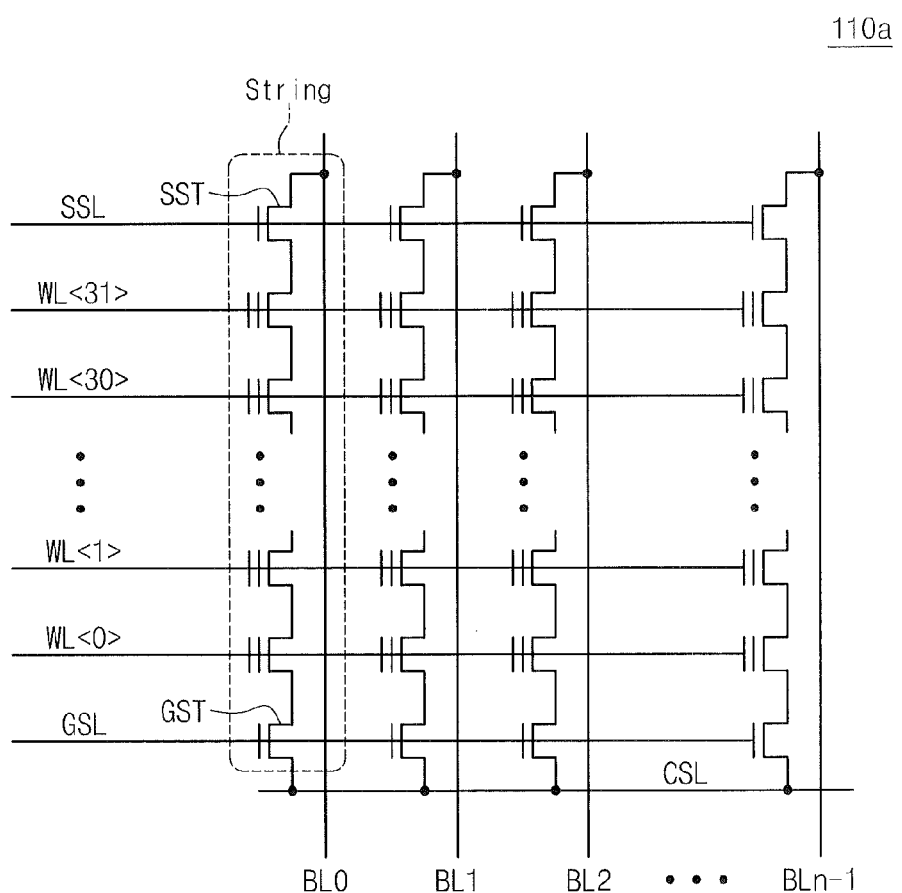
FIG. 2 is a circuit diagram of a planar cell array of FIG. 1 according to an exemplary embodiment of the inventive concept.

FIG. 2 is a circuit diagram illustrating an exemplary embodiment of the cell array 110 of FIG. 1. FIG. 2 illustrates a planar cell array 110a.

Referring to FIG. 2, the planar cell array 110a includes a plurality of memory blocks. One memory block is illustrated in FIG. 2. The memory blocks include a plurality of cell strings. The cell string is the unit of memory cells connected in series. The memory cells included in any one of the cell strings may be selected by the same selection transistor.

The planar cell array 110a has a cell string structure. Each cell string includes a string selection transistor SST connected to a string selection line SSL, a plurality of memory cells connected to a plurality of word lines WL<0>~WL<31>, and a ground selection transistor GST connected to a ground selection line GSL. The string selection transistor SST is connected to a bit line GL and the ground selection transistor GST is connected to a common source line CSL.

A plurality of memory cells may be connected to the word line (e.g., WL<1>). A set of memory cells, which are connected to one word line and are simultaneously programmed, is called a page. The planar cell array 110a may be formed in multiple layers in the nonvolatile memory device 100.

Figure 3:
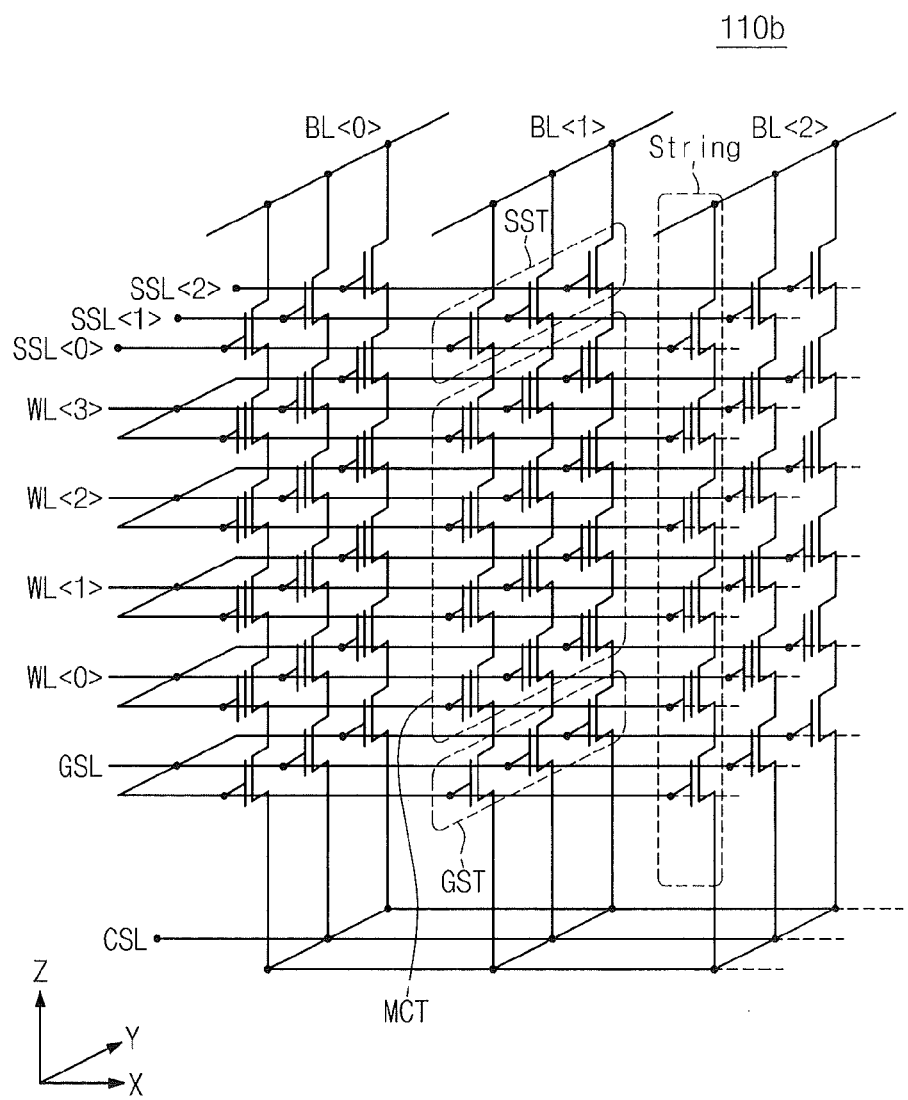
FIG. 3 is a circuit diagram of a vertical cell array of FIG. 1 according to an exemplary embodiment of the inventive concept.

FIG. 3 is a circuit diagram illustrating another exemplary embodiment of the cell array 110 of FIG. 1. FIG. 3 illustrates a vertical cell array 110b of a Vertical NAND flash memory (hereinafter referred to as VNAND).

Referring to FIG. 3, the vertical cell array 110b includes a plurality of bit lines BL<0>~BL<2> arranged in the Y direction at the top thereof. Also, a common source line CSL is arranged at the bottom XY plane. A plurality of cell strings are arranged in the vertical direction (i.e., the Y direction) between the bit lines BL<0>~BL<2> and the common source line CSL.

The characteristics of the vertical cell array 110b will be described through a description of the cell strings connected to one bit line BL<1>. Each of the cell strings connected to the bit line BL<1> includes a string selection transistor SST. By the string selection transistor SST, the cell strings are electrically connected/disconnected to/from the bit line BL<1>. Also, each of the cell strings connected to the bit line BL<1> includes a ground selection transistor GST. By the ground selection transistor GST, the cell strings are electrically connected/disconnected to/from the common source line CSL. Also, memory cell transistors MCT connected in series are arranged in the Z direction between the string selection transistor SST and the ground selection transistor GST.

In the vertical cell array 110b according to an exemplary embodiment of the inventive concept, the word line WL<3> is connected in common to the memory cell transistors included in one layer. Also, each of the word lines WL<0>~WL<3> is connected in common to the memory cell transistors of the corresponding layer. Thus, the memory cell transistors included in one layer receive the same word line (WL) voltage. In a program operation, a program voltage Vpgm may be applied to a selected one of the word lines WL<0>~WL<3> and a pass voltage Vpass may be applied to the other unselected word lines. Thus, all the memory cells of the layer corresponding to the selected word line receive the program voltage Vpgm.

On the other hand, the string selection transistors SST included in one layer are connected to a plurality of string selection lines SSL<0>~SSL<2>. The strings connected to the same bit line may be selected or unselected by the string selection lines SSL<0>~SSL<2>. Also, the vertical cell array 110b with a vertical string structure includes a ground selection line GSL for controlling the ground selection transistors GST.

The above-described word line structure is merely an example for describing the features of the inventive concept. Some of the memory cells included in one layer may be connected to another word line that are electrically isolated. Herein, the X, Y and Z directions perpendicular to each other are exemplarily illustrated to describe the three-dimensional vertical cell array 110b. However, the structures of the inventive concept are not limited to the case where the X, Y and Z directions are perpendicular to each other.

Figure 4:
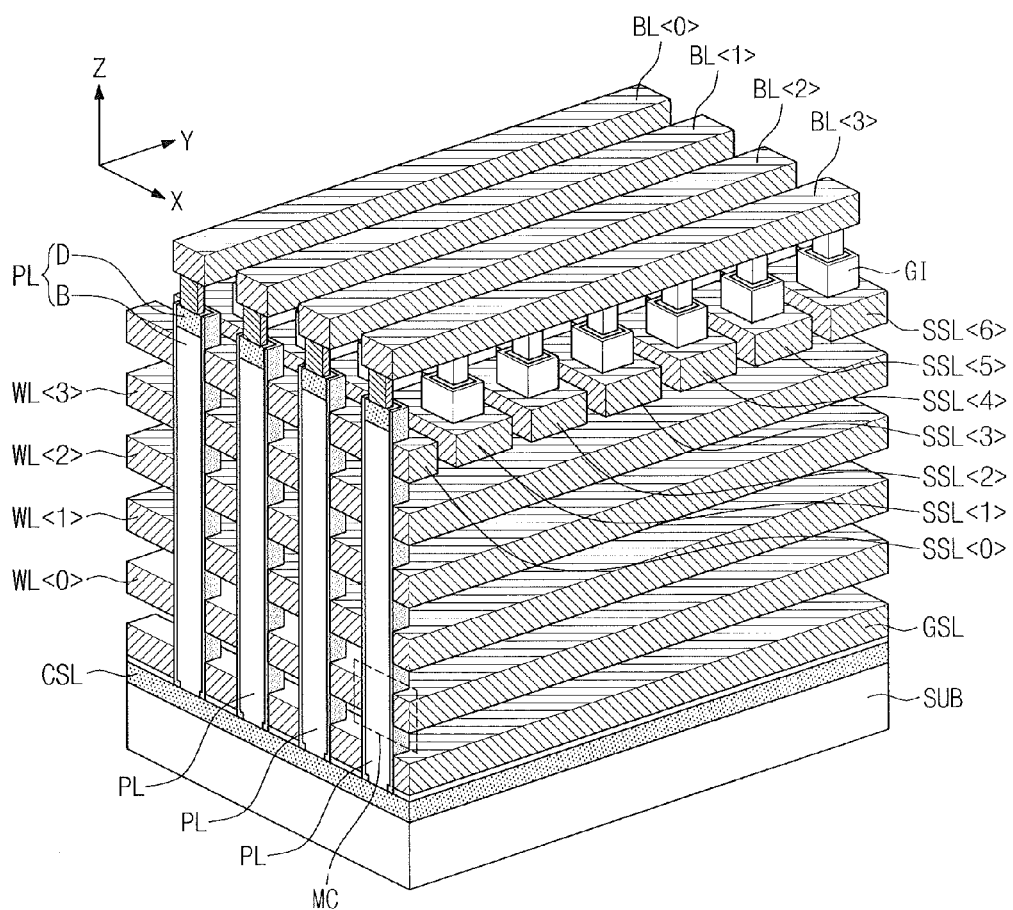
FIGS. 4 to 6 are perspective views showing various embodiments of the vertical cell array of FIG. 3.

FIG. 4 is a perspective view showing an exemplary embodiment of the vertical cell array 110b of FIG. 3.

Referring to FIG. 4, a vertical cell array 110b includes a common source line CSL, a plurality of bit lines BL<0>~BL<3>, and a plurality of cell strings arranged between the common source line CSL and the bit lines BL<0>~BL<3>.

The common source line CSL may be a conductive thin film disposed on a substrate SUB or an impurity region formed in the substrate SUB. The bit lines BL<0>~BL<3> may be conductive patterns (e.g., metal lines) that are disposed on the substrate SUB while being spaced apart from the substrate SUB. A plurality of cell strings are connected in parallel to each of the bit lines BL<0>~BL<3> that are arranged two-dimensionally. Accordingly, the cell strings are two-dimensionally arranged on the common source line CSL or the substrate SUB.

Each of the cell strings includes a ground selection transistor GST connected to the common source line CSL, a string selection transistor SST connected to the bit lines BL<0>~BL<3>, and a plurality of memory cell transistors MCT disposed between the ground selection transistor GST and the string selection transistor SST. The ground selection transistor GST, the string selection transistor SST and the memory cell transistors MCT may be connected in series. In addition, a ground selection line GSL, word lines WL<0>~WL<3> and string selection lines SSL<0>~SSL<6>, which are disposed between the common source line CSL and the bit lines BL<0>~BL<3>, may be used as the gate electrodes of the memory cell transistors MCT and the string selection transistors SST.

All of the ground selection transistors GST may be disposed at substantially the same distance from the substrate SUB. Their gate electrodes may be isolated by a plurality of conductors in the Y direction.

The gate electrodes of the memory cell transistors MCT, which are disposed at substantially the same distance from the common source line CSL, may be in an equipotential state by being connected in common to one of the word lines WL<0>~WL<3>. To this end, each of the word lines WL<0>~WL<3> may be plate-shaped or comb-shaped conductive patterns parallel to the top surface. Meanwhile, one cell string includes a plurality of memory cell transistors MCT that are disposed at different distances from the common source line CSL. Thus, multi-layered word lines WL<0>~WL<3> may be disposed between the common source line CSL and the bit lines BL<0>~BL<3>.

Each of the cell strings may includes a semiconductor pillar PL that extends vertically from the common source line CSL to connect to the bit lines BL<0>~BL<3>. The semiconductor pillars PL may be formed to penetrate the ground selection line GSL and the word lines WL<0>~WL<3>. In addition, the semiconductor pillar PL may include a body portion B and impurity regions formed at one end or both ends of the body portion B. For example, a drain region D may be formed between the top (i.e., the body portion B) of the semiconductor pillar PL and the bit lines BL<0>BL<3>.

Meanwhile, a data storage layer may be disposed between the semiconductor pillar PL and the word lines WL<0>~WL<3>. The data storage layer may be a charge storage layer. For example, the data storage layer may be one of a trap insulating layer and an insulating layer including a floating gate electrode or conductive nano dots.

A dielectric layer used as a gate insulating layer of the ground selection transistor GST or the string selection transistor SST may be disposed between the ground selection line GSL and the semiconductor pillars PL or between the string selection lines SSL<0>~SSL<6> and the semiconductor pillars PL. The gate insulating layer of at least one of the ground/string selection transistors GST/SST may be formed of the same material as the data storage layer of the memory cell transistor MCT, and may also be a gate insulating layer (e.g., a silicon oxide layer) used in a typical MOSFET.

The ground/string selection transistors GST/SST and the memory cell transistors MCT may be MOSFETs that use a semiconductor pillar PL as a channel region. According to another exemplary embodiment, the semiconductor pillars PL may constitute a MOS capacity together with the ground selection line GSL, the word lines WL<0>~WL<3> and the string selection lines SSL<0>~SSL<6>. In this case, the ground selection transistors GST, the memory cell transistors MCT and the string selection transistors SST may be electrically connected to each other by sharing an inversion layer formed by a fringe field from the ground selection transistor GSL, the word lines WL<0>~WL<3> and the string selection lines SSL<0>~SSL<6>.

Meanwhile, the bit lines BL<0>~BL<3> and the string selection lines SSL<0>~SSL<6> are formed to intersect each other. In this case, the electrical connection between a selected cell string and a selected bit line (hereinafter referred to as the selective connection) may be controlled by the voltages applied respectively to the bit lines BL<0>~BL<3> and the string selection lines SSL<0>~SSL<3>.

The vertical cell array 110 described with reference to FIGS. 3 and 4 is formed through layer-by-layer fabrication process. Thus, if any cell has a defect, the entire string with the defective cell becomes defective. A string with a defective cell is detected and it may be used as weak column (WC) information.

Figure 5:
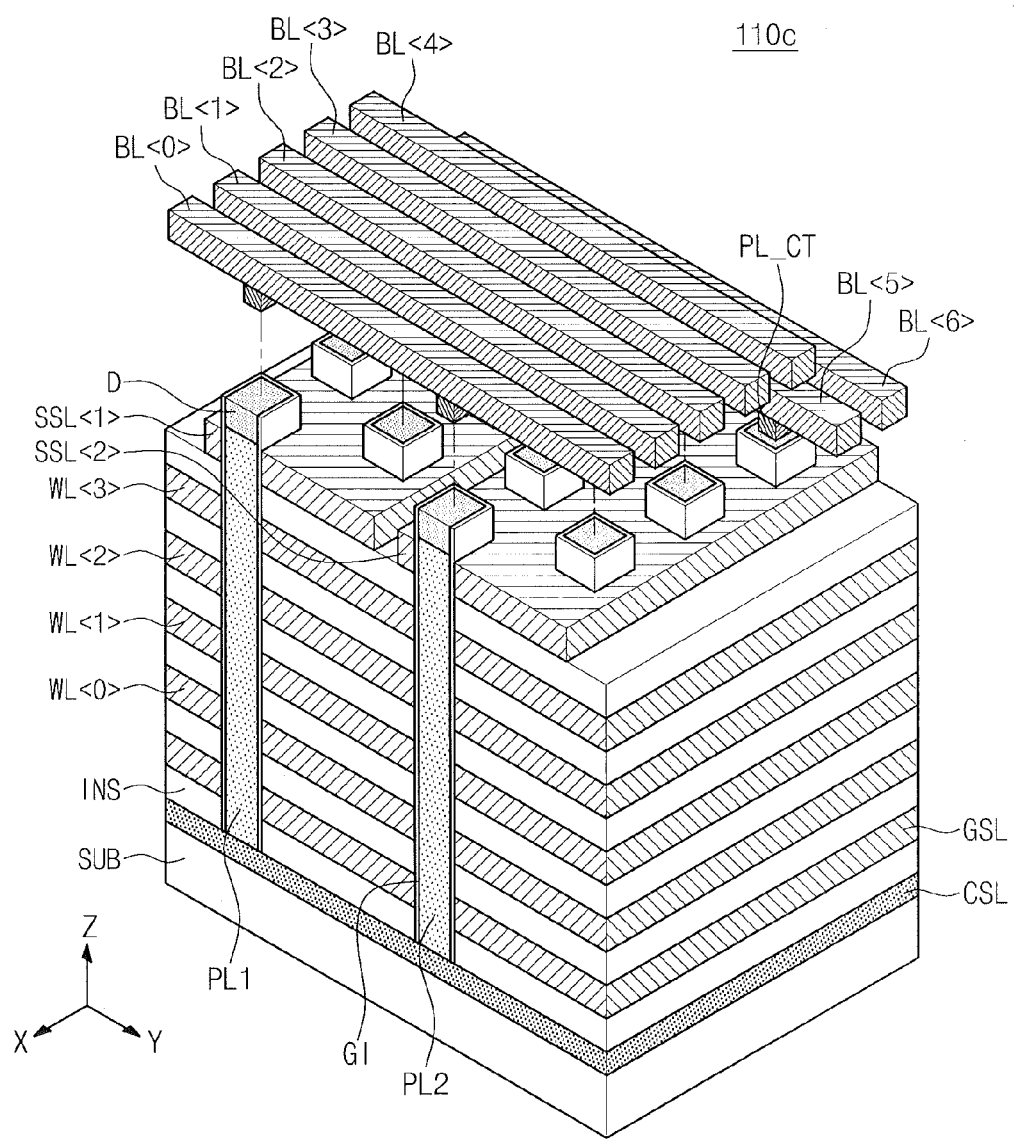
Figure 6:
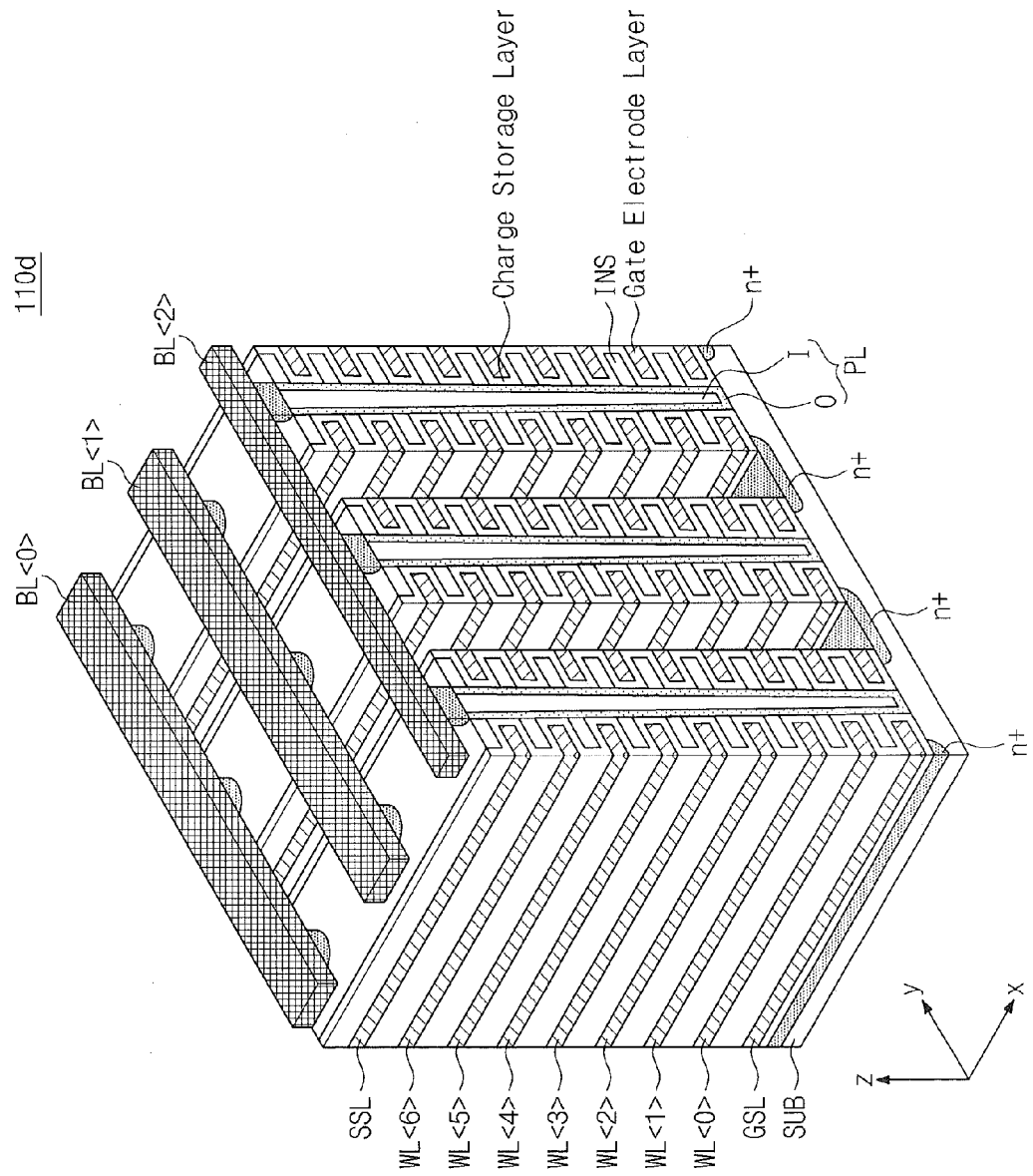

FIGS. 5 and 6 are perspective views showing other exemplary embodiments of the vertical cell array according to the inventive concept.

A description of an overlap with the embodiment of FIG. 4 will be omitted for conciseness.

FIG. 5 is a perspective view showing another exemplary embodiment of the vertical cell array according to the inventive concept.

Referring to FIG. 5, a vertical cell array 110c may include two string selection lines SSL<1> and SSL<2> at the top thereof. The string selection line SSL<1> may control the electrical connection between bit lines BL<0>~BL<6> and an active pillar PL1 having the string selection line SSL<1> as a gate. The string selection line SSL<2> may control the electrical connection between the bit lines BL<0>~BL<6> and an active pillar PL2 having the string selection line SSL<2> as a gate. It is illustrated that the vertical cell array 110c includes two string selection lines SSL<1> and SSL<2>. However, the inventive concept is not limited thereto and the vertical cell array 110c may include two or more string selection lines. The string selection lines SSL<1> and SSL<2> may be selection plates as illustrated in FIG. 5. The string selection lines SSL<1> and SSL<2> may extend in the X direction.

A ground selection line GSL may be formed at the bottom. The string selection line SSL<1> and the ground selection line GSL may control active pillars PL that are vertically arranged. The active pillars PL may be formed to penetrate the string selection lines SSL<1> and SSL<2> and the ground selection line GSL.

FIG. 6 is a perspective view showing another exemplary embodiment of the vertical cell array according to the inventive concept.

Referring to FIG. 6, a vertical cell array 110d may include a plurality of string selection lines SSLs at the top thereof. The vertical cell array 110d may include a ground selection line GSL at the bottom thereof. Although it is illustrated that the vertical cell array 110d includes the plurality of string selection lines SSLs and a ground selection line GSL, the inventive concept is not limited thereto.

The string selection line SSL and the ground selection line GSL may control active pillars that are vertically arranged. The string selection line SSL and the ground selection line GSL may control the same active pillars.

By forming an active pillar, a string of the vertical cell array 110b/110c/110d forms one cell string. In a program operation, the active pillar with a channel formed has such a penetrating structure. Thus, the probability of generation of a string-by-string defect is high in the vertical cell array that forms an active pillar by penetrating after forming a plurality of layers.

Figure 7:
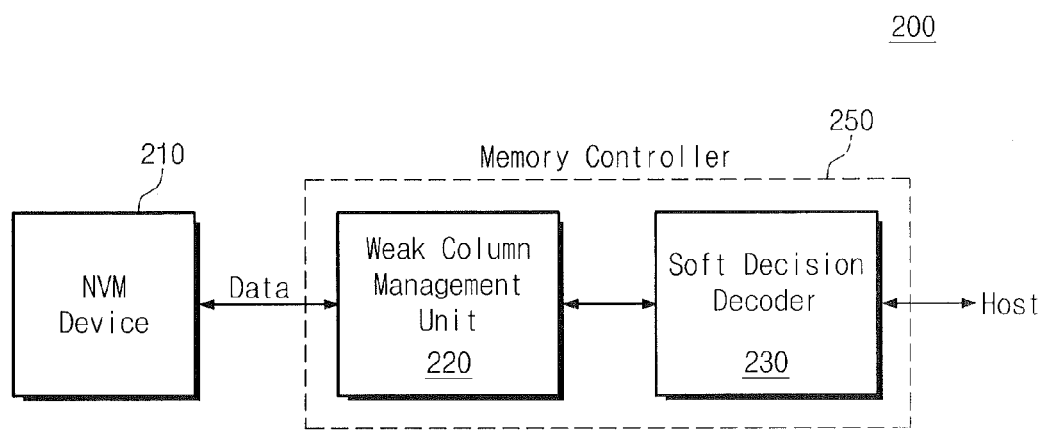
FIG. 7 is a block diagram of a memory system according to an exemplary embodiment of the inventive concept.

FIG. 7 is a block diagram of a memory system according to an exemplary embodiment of the inventive concept.

Referring to FIG. 7, a memory system 200 according to an exemplary embodiment of the inventive concept includes a nonvolatile memory device 210 and a memory controller 250. The memory controller 250 includes a weak column (WC) management unit 220 and a soft decision decoder 230.

For example, the nonvolatile memory device 210 may include a flash memory device. According to the command and control of the memory controller 250, the nonvolatile memory device 210 reads data or programs data, received from the memory controller 250, in a cell array. The nonvolatile memory device 210 is substantially identical to the nonvolatile memory device 100 of FIG. 1.

The memory controller 250 may process read data, received from the nonvolatile memory device 210, according to a soft decision algorithm. In a soft decision decoding process, a different weight (in comparison with a normal column) is applied to a defective column or a weak column with back pattern dependency. For this soft decision process, the memory controller 250 includes a weak column management unit 220 and a soft decision decoder 230.

The weak column management unit 220 detects a weak column. When read data are transferred from the nonvolatile memory device 210 to the memory controller 250, the weak column management unit 220 provides WC information of the read data to the soft decision decoder 230.

The soft decision decoder 230 performs a soft decision operation on the read data with reference to the WC information. An example of the soft decision operation is a decoding scheme that determines the bit values of the read data according to a maximum likelihood criterion. According to the maximum likelihood criterion, the soft decision decoder 230 may add a different weight (in comparison with a normal column) to the bits corresponding to a weak column. Another example of the soft decision operation is an erasure decoding scheme that sets the bits for the weak column to 'erasure' and performs an error correction operation (ECC).

The memory system 200 according the exemplary embodiment of FIG. 7 can solve the problem of a defective column or a weak column with high error probability without using a column redundancy.

Figure 8:
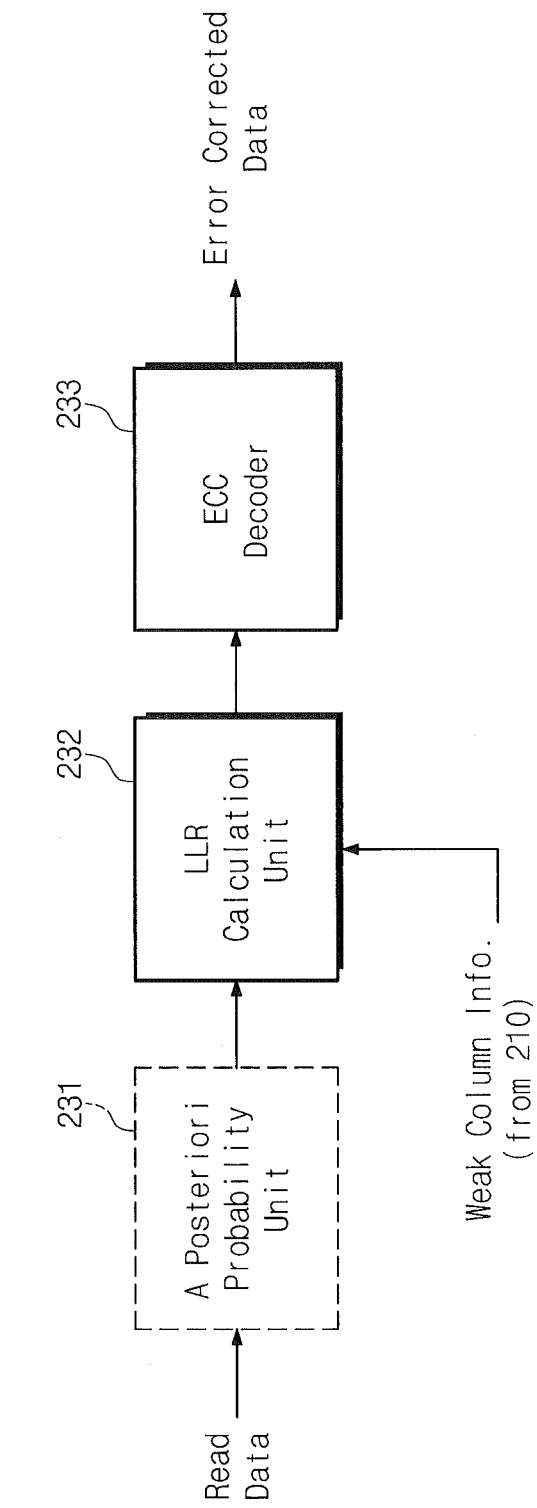
FIG. 8 is a block diagram of a soft decision decoder of FIG. 7 according to an exemplary embodiment of the inventive concept.

FIG. 8 is a block diagram of the soft decision decoder 230 according to an exemplary embodiment of the inventive concept.

Referring to FIG. 8, the soft decision decoder 230 includes an a posteriori probability unit 231 and a log-likelihood ratio (LLR) calculation unit 232, and a ECC decoder 233. Through the above-described configurations, the soft decision decoder 230 performs a soft decision operation by applying a different weight (in comparison with a normal column) to the bits corresponding to a weak column. Also, it can calculate an LLR without using the a posteriori probability unit 231.

The a posteriori probability unit 231 calculates the a posteriori probability for each of the bits of the read data. If hypotheses are set for the uncertain past event under the condition of an already-occurred event, the conditional probability of each hypothesis becomes an a posteriori probability. Thus, defining the hypothesis corresponding to the highest a posteriori probability as 'true' is defined as the Maximum A posteriori Probability (MAP) criterion.

Herein, the a posteriori probability means the conditional probability of the previously-occurred event (i.e., the programmed bit value of a specific column) under the condition of the currently-occurred event (the logic value of a specific column of the read data). If the currently-read bit is a logic '1', the probability of being programmed to a logic '1' in the program operation and the probability of being programmed to a logic '0' are defined as the a posteriori probability. If 'Y' is the bit of read data and 'S' is the bit of program data, the a posteriori probabilities for the above-described respective conditions may be expressed as P(S=1/Y=1) and P(S=0/Y=1). Also, if is a random read value (the threshold voltage of a cell in a flash memory), the a posteriori probabilities may be expressed as P(S=1/Y) and P(S=0/Y). If the a priori probability P(S=0) and P(S=1) are equal, the maximum a posteriori probability (MAP) and the maximum likelihood are equal.

The LLR calculation unit 232 considers the WC information of the inventive concept and the LLR calculated from the above-described read value. The LLR of the above-described a posteriori probabilities may be expressed as Equation (1).

$$LLR(Y) = \log \frac{P(Y/S=0)}{P(Y/S=1)} \quad (1)$$

The symbol of the LLR (Y) in Equation (1) is a criterion for determination of a logic '0' or a logic '1' and the absolute value represents the reliability of a hypothesis or the reliability of a soft decision result.

The LLR calculation unit 232 calculates the above-described LLR for each of the bits of read data. With reference to the WC information, the LLR calculation unit 232 according to an exemplary embodiment imposes a different weight (in comparison with a normal column) on the above-described LLR. That is, it may reduce the uncertainty in a soft decision operation by reducing the absolute value of the LLR for a high-uncertainty interval in comparison with the normal columns. This concept will be described below in detail with reference to FIG. 9.

The ECC decoder 233 performs a decoding operation with reference to the above-described LLR. An error correction operation (ECC) may use a turbo code, a convolutional code, an RSC code, an RA code, an RS code, a BCH code and an LDPC code for the soft decision decoder. The bit value determined by the ECC decoder 233 is outputted as the determination value of read data and is outputted as error-corrected data.

In the above, a description has been made of an exemplary embodiment that sets a weight, which is used in the calculation of an LLR, to a weak column differently in comparison with a normal column. This different management of a weak column can increase the error correction probability of the weak column.

Figure 9:
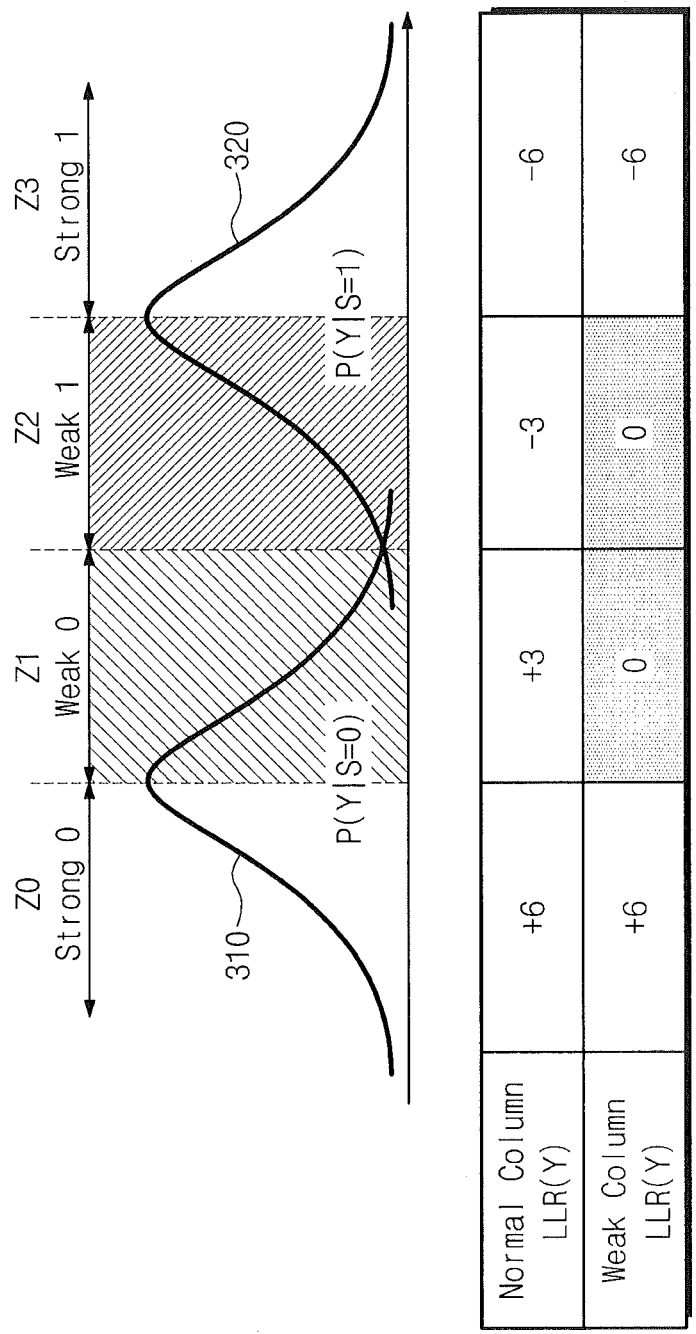
FIG. 9 is a graph showing the distribution of a posteriori probabilities.

FIG. 9 is a diagram illustrating an example of setting a log-likelihood ratio (LLR). FIG. 9 illustrates conditional probability distributions P(Y/S=0) and P(Y/S=1).

Referring to FIG. 9, if a memory cell is determined to be strong 0 in a region Z3, an LLR is determined to be 6. However, if the memory cell belongs to a weak column, the LLR may be changed to 0. Although FIG. 9 illustrates a 2-bit soft decision value, it may also be applicable to a 3 or more-bit soft decision operation. If a 3-bit soft decision operation is performed, the total number of decision regions is 8. The LLR value allocated to each region may vary according to channel states or distribution states.

Herein, it is assumed to be a soft decision decoding scheme that divides each probability region into four probability regions Z0, Z1, Z2 and Z3 for determination. Then, the probability regions Z1 and Z2 correspond to the probability region where two hypotheses (i.e., the hypothesis of being programmed to a logic '1' and the hypothesis of being programmed to a logic '0') overlap each other.

It is assumed that the LLRs of normal columns for the respective probability regions Z0, Z1, Z2 and Z3 are expressed as (+6, +3, −3, −6). If a cell belongs to a weak column, the LLR may be set to '0' regardless of which cell the cell belongs to. In another embodiment, the LLR value of the cell belonging to the weak column may be decreased at a predetermined rate. For example, even if the LLR of a cell is 6 in the region Z3, when a rate of 3 is applied, the LLR is 2 (=6/3).

In an exemplary embodiment of the inventive concept, the absolute value of the LLR for the probability regions Z0 and Z3 with a high probability of being 'true' when selected is set to be great, and the absolute value of the LLR for the probability regions Z1 and Z2 generating an error when selected is set to be small. According to such settings, it has been known that a soft decision operation can correct more errors than a hard decision operation.

Figure 10:
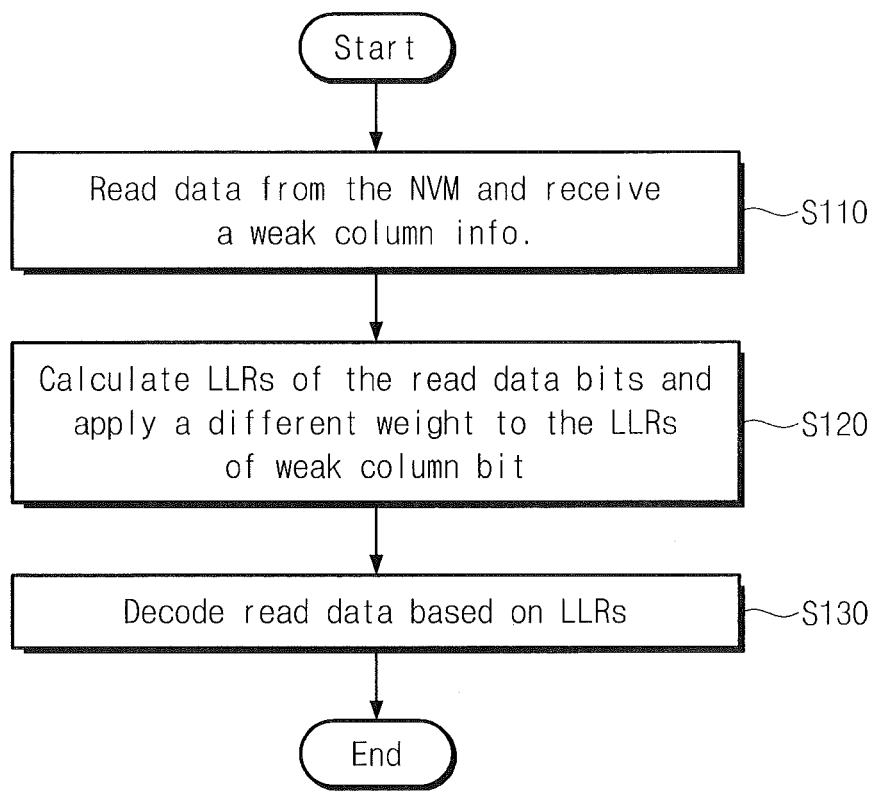
FIG. 10 is a flow chart illustrating a data processing method according to an exemplary embodiment of the inventive concept.

FIG. 10 is a flow chart illustrating a data processing method according to an exemplary embodiment of the inventive concept.

Referring to FIG. 10, when receiving a read command from the host, the memory controller 250 starts a data processing process.

In step S110, the memory controller 250 provides a read command and an address to the nonvolatile memory device 210. In response to the read command, the nonvolatile memory device 210 reads data and provides the read data to the memory controller 250. The nonvolatile memory device 210 may simultaneously provide WC information and the read data. For the WC information, the addresses of weak columns detected in a test process may be stored in a certain region of the nonvolatile memory device 210. The WC information may be provided to the memory controller 250 in a power-on-reset (POR) operation or a typical reset operation in response to the request of the memory controller 250. A weak column generated during use like a progressive defect may be detected in a merge operation of the nonvolatile memory device 210 and may be stored as WC information.

In step S120, the LLR of each of the read bits is calculated. A different weight is applied to the bits of an address corresponding to the weak column, in comparison with the bits of an address corresponding to a normal column. That is, the absolute value of an LLR corresponding to the weak column is controlled to be smaller than the absolute value of an LLR corresponding to the normal column. Reducing or controlling the absolute value of the LLR of the weak column can increase the error correction probability in a soft decision operation. Also, the LLR of the weak column may be maintained and the LLR of the cells not belonging to the weak column may be increased.

In step S130, the ECC decoder 233 of the memory controller 250 performs an ECC decoding operation on the read data with reference to the LLR. After the ECC decoding operation, the read data are outputted as error-corrected data.

In the above, an LLR scheme has been exemplified to apply the maximum likelihood criterion. However, the determination scheme of the inventive concept is not limited thereto. That is, the objects of the inventive concept may be achieved even without using the log value of an a posteriori probability. The scheme of not using the log value of an a posteriori probability is called a likelihood ratio (LR) scheme. The criterion value for the soft decision algorithm may be provided by various other calculation schemes.

Figure 11:
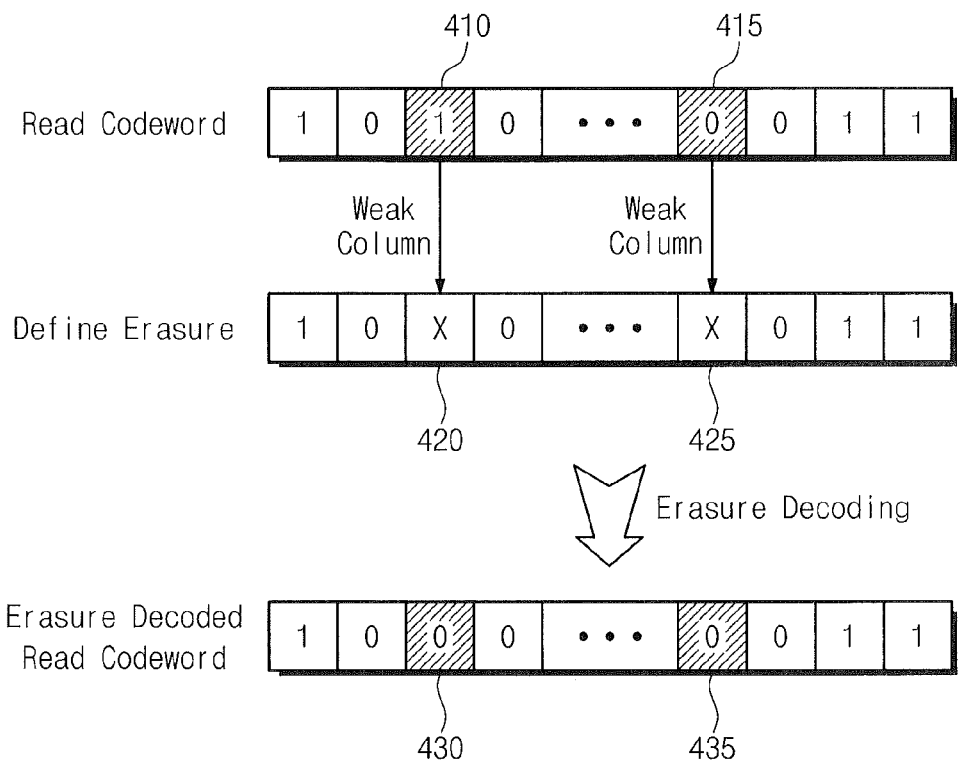
FIG. 11 is a diagram illustrating a data processing method according to another exemplary embodiment of the inventive concept.

FIG. 11 is a diagram illustrating a data processing method according to another exemplary embodiment of the inventive concept.

Referring to FIG. 11, a weak column among the read data may be treated as erasure and an error may be corrected by erasure decoding.

When data are read from the nonvolatile memory device 210, they may be managed as one page unit. In the drawings, it is assumed that two bits 410 and 415 correspond to a weak column. The bit 410 is read as a logic '1' and the bit 415 is read as a logic '0'. However, the read value of the bits 410 and 415 is low in reliability because it corresponds to the weak column.

The weak column management unit 220 sets all the bits 410 and 415 corresponding to the weak column (among the bits of the read page) to 'erasure'. The bits set to 'erasure' by the weak column management unit 220 are denoted by 'X' in FIG. 11. Typically, erasure bits 420 and 425 mean errors whose generation locations can be known. Herein, since the bits of the weak column corresponding to the error location are set to 'erasure', it means that the erasure bits 420 and 425 can be corrected through an erasure decoding operation.

The bits 420 and 425 set to 'erasure' may be processed by erasure decoding. The soft decision decoder 230 of FIG. 7 uses an erasure decoding scheme to process a code word or a page including the erasure bits 420 and 425. For example, the soft decision decoder 230 may perform an error correction operation by replacing all the erasure bits 420 and 425 with a logic '0'. Also, the soft decision decoder 230 may perform an error correction operation by replacing all the erasure bits 420 and 425 with a logic '1'. Also, the soft decision decoder 230 may perform an error correction operation by replacing the erasure bits 420 and 425 with a suitable combination of a logic '0' and a logic '1'.

The soft decision decoder 230 selects a data stream, which is outputted as decoding success, among the results of the respective error correction operations, as the final decoding data. However, two or more decoding successes may occur. If two decoding results are equal to each other, there is no problem in error correction even when selecting one of the two decoding results. Thus, even if any one of the two decoding results, the original data programmed in the nonvolatile memory device 210 may be recovered.

However, two or more decoding successes may occur, and the data outputted as the respective decoding results may have different values. In this case, the soft decision decoder 230 may obtain a more accurate output value by selecting the one having a smaller Hamming distance from the read data (i.e., read page). FIG. 11 illustrates an example where the bit 410 having a logic '1' when read out is corrected into the bit 430 with a logic '0' as a result of erasure decoding.

Figure 12:
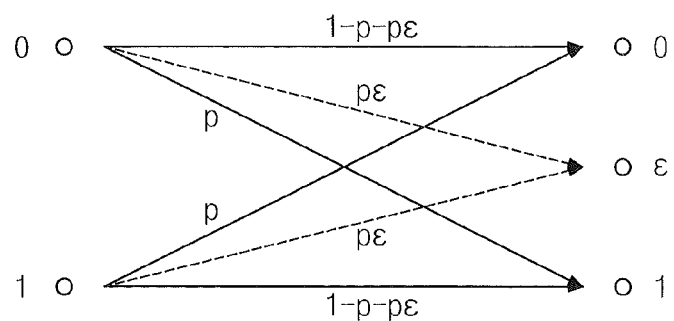
FIG. 12 is a diagram illustrating the concept of erasure decoding.

FIG. 12 illustrates a channel model of binary input-nonbinary output for showing the concept of erasure.

Referring to FIG. 12, input data is a logic '1' or a logic '0', but the output value has one of a logic '1', a logic '0' and an erasure $\in$. It is assumed that, if the input data is logic '0', the error probability of the output being a logic '1' is 'p' and the probability of the output being an erasure $\in$ is 'p$\in$'. Then, the probability of not outputting an error or an erasure is '1-p-p$\in$'. In this channel model, the error and the erasure are defined by the presence/absence of error generation location information. The error means an error with an unknown generation location, and the erasure means an error with only a known generation location. The above-described weak column information provides the error location information and means that the bit corresponding to the weak column can be treated as 'erasure'.

Figure 13:
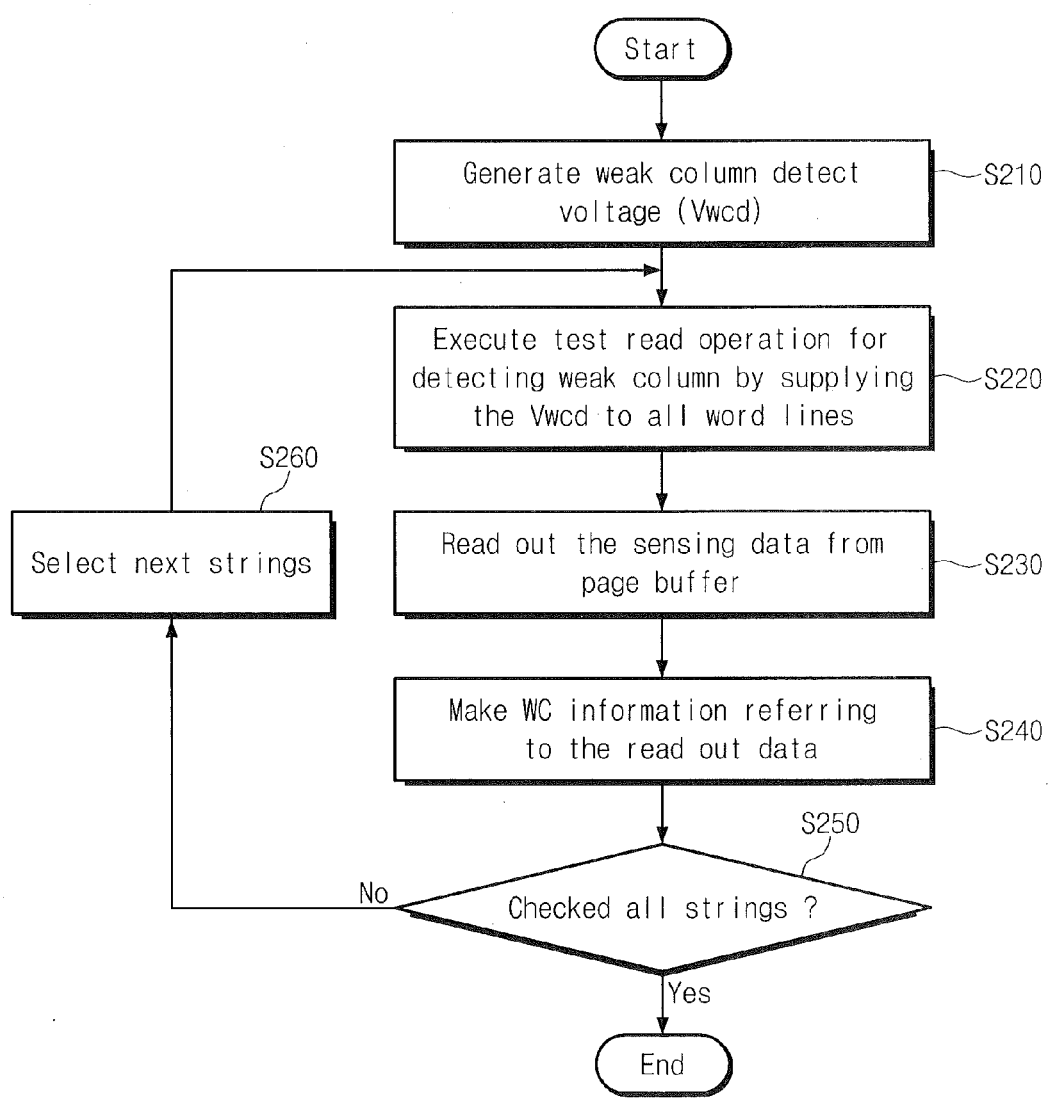
FIG. 13 is a flow chart illustrating a method of acquiring weak column (WC) information according to an exemplary embodiment of the inventive concept.

FIG. 13 is a flow chart illustrating a method of acquiring weak column (WC) information according to an exemplary embodiment of the inventive concept. FIG. 13 illustrates a method for detecting the occurrence/nonoccurrence of a defect in strings included in the planar cell array or the vertical cell array.

Referring to FIG. 13, in step S210, a word line voltage Vwcd is generated to detect a weak column or a defective column. Hereinafter, the word line voltage Vwcd will be referred to as a weak column detection voltage Vwcd. The weak column detection voltage Vwcd is a word line voltage that is provided simultaneously to all the word lines of a selected string. The weak column detection voltage Vwcd may be higher than the program state corresponding to the highest threshold voltage among the program states of a memory cell. For example, the weak column detection voltage Vwcd may be higher than or equal to an unselected read voltage Vread that is provided to an unselected word line in a read operation. In another embodiment, the weak column detection voltage Vwcd may be equal to or lower than or higher than a pass voltage Vpass that is provided to an unselected word line in a program operation.

In step S220, the generated weak column detection voltage Vwcd is used to detect cell strings corresponding to a weak column. First, the bit lines corresponding to the selected strings are precharged. The bit line precharging operation may be performed by the page buffer connected to each of the bit lines. When the bit line precharging operation is completed, the weak column detection voltage Vwcd is applied to all the word lines of the selected cell strings.

Herein, a power supply voltage may be applied to the ground selection transistor GSL and the string selection line SSL of the selected strings. In particularly, the ground selection line GSL may connect the selected strings to the common source line CSL for a predetermined time. After the lapse of the predetermined time, a signal (a ground selection signal) may be provided to control the ground selection line to electrically disconnect the selected strings from the common source line.

Application of the weak column detection voltage Vwcd turns on all the channels of the selected cell strings. The channel of a defective string may be disconnected, failing to be turned on. In this case, the precharged bit line voltage may fail to be discharged. Thus, a logic '0' is latched by a sensing latch of the page buffer connected to a defective string, and a logic '1' is latched by a sensing latch corresponding to a normal string.

In step S230, the sensing data latched in the page buffer is outputted. The sensing data for determination of the presence/absence of a weak column may be transferred to the memory controller 250. The memory controller 250 may further include a memory device for storing the sensing data.

In step S240, the memory controller 250 detects a column address corresponding to the weak column with reference to the sensing data. For example, the memory controller 250 may detect a column address corresponding to a logic '0' with reference to the sensing data. The memory controller 250 may store a column address corresponding to a logic '0' as WC information with reference to the sensing data.

In step S250, it is determined whether the selected strings are all detected. In the planar NAND flash memory device, the detection operation may be performed on a block-by-block basis. For example, if a WC detection operation on all the memory blocks in the cell array is completed, a detection operation for acquiring WC information is ended. On the other hand, if there are blocks failing to complete WC detection, the method proceeds to step S260 to select the next strings in order to perform WC detection.

In step S260, the strings failing to perform WC detection are selected. In a planar NAND flash memory device, a block not performing WC detection may be selected. On the other hand, in a vertical NAND flash memory device, a string selection line with a selected voltage applied may be changed to perform the selection operation. Upon completion of the string selection, the method proceeds to step S220 to perform a detection operation by the weak column detection voltage Vwcd.

In the above, a description has been made of a sensing operation for acquiring WC information. The WC information generated by the memory controller 250n may be stored in a certain region of the nonvolatile memory device or the memory controller. Also, the WC information may be continuously updated if necessary.

Figure 14:
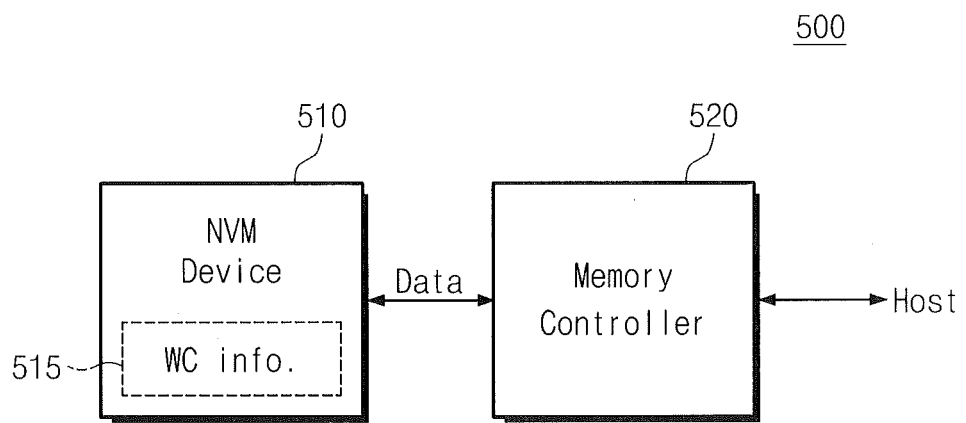
FIGS. 14 and 15 are block diagrams illustrating the storage locations of WC information.
Figure 15:
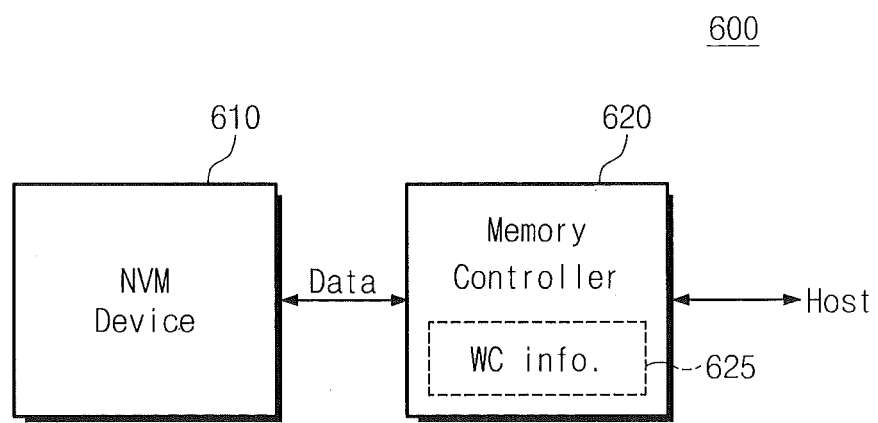

FIGS. 14 and 15 are block diagrams illustrating the storage locations of WC information according to other embodiments of the inventive concept.

FIG. 14 is a block diagram of a memory system 500 that stores WC information 515 in a nonvolatile memory device 510.

Referring to FIG. 14, the WC information 515 may be detected in a test process for a nonvolatile memory device 510 and may be stored in a certain memory region of the nonvolatile memory device 510. The WC information 515 may be provided to a memory controller 520 when the memory system 500 is reset. Then, the memory controller 520 may use the WC information 515 as control information in a soft decision operation or an erasure decoding operation.

The WC information 515 may include information about a progressive defect. A defective column generated according to an increase in the program/erase (P/E) cycle of a memory cell may be detected in a merge operation controlled by the memory controller 520. That is, the memory controller 520 may detect a column with errors more than a reference value in a merge operation and may update an address of the detected column as WC information.

FIG. 15 is a block diagram of a memory system 600 that stores WC information 625 in a memory controller 620.

Referring to FIG. 15, the WC information 625 may be detected in a test process for a nonvolatile memory device 610 and may be stored in a certain memory region of the nonvolatile memory device 610. The WC information 625 may be provided to the memory controller 620 when the memory system 600 is reset. The WC information 625 may be stored in a memory device such as a RAM or a ROM of the memory controller 620. Then, the memory controller 620 may use the WC information 625 as control information in a soft decision operation or an erasure decoding operation.

Figure 16:
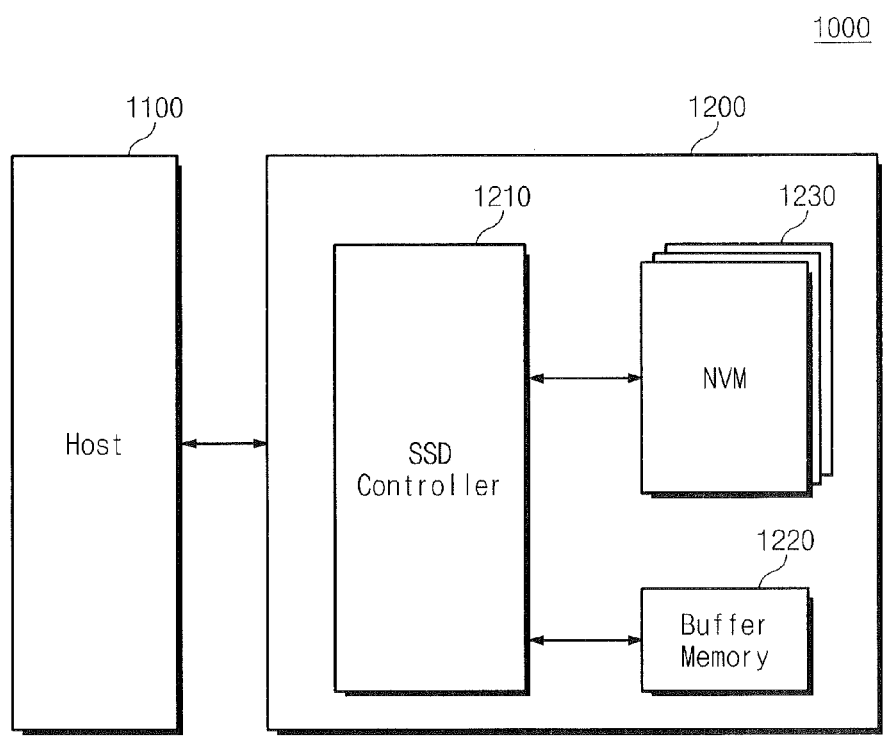
FIG. 16 is a block diagram of a solid state drive (SSD) according to an exemplary embodiment of the inventive concept.

FIG. 16 is a block diagram of a solid state drive (SSD) system (as an example of a memory system) according to an exemplary embodiment of the inventive concept.

Referring to FIG. 16, an SSD system 1000 according to an exemplary embodiment of the inventive concept includes a host 1100 and an SSD 1200. The SSD 1200 includes an SSD controller 1210, a buffer memory 1220, and a nonvolatile memory device 1230.

The SSD controller 1210 provides a physical interface with the host 1100 and the SSD 1200. That is, the SSD controller 1210 provides an interface with the SSD 1200 according to the bus format of the host 1100. In particular, the SSD controller 1210 decodes a command received from the host 1100. According to the decoding result, the SSD controller 1210 accesses the nonvolatile memory device 1230. Examples of the bus format of the host 1100 include USB (Universal Serial Bus), SCSI (Small Computer System Interface), PCI express, ATA, PATA (Parallel ATA), SATA (Serial ATA), and SAS (Serial Attached SCSI).

In response to a read request from the host 1100, the SSD controller 1210 processes read data, received from the nonvolatile memory device 1230, with reference to weak column (WC) information. The SSD controller 1210 may process the read data by an erasure decoding scheme with reference to WC information. Also, the SSD controller 1210 may increase the reliability of decision by applying a different weight (in comparison with a normal column) to a weak column in a soft decision algorithm of the read data.

The buffer memory 1220 temporarily stores write data provided from the host 1100 or data read from the nonvolatile memory device 1230. If the data in the nonvolatile memory device 1230 are cached at a read request of the host 1100, the buffer memory 1220 supports a cache function of directly providing the cached data to the host 1100. Typically, the data transfer rate according to the bus format (e.g., SATA or SAS) of the host 1100 is much higher than the data transfer rate of a memory channel of the SSD 1200. That is, if the interface speed of the host 1100 is much higher, a mass buffer memory 1220 is provided to minimize the performance degradation caused by the speed difference.

The buffer memory 1220 may include a synchronous DRAM to provide sufficient buffering in the SSD 1200 used as a mass auxiliary memory device. However, those skilled in the art will readily understand that the buffer memory 1220 is not limited to the disclosure herein.

The nonvolatile memory device 1230 may be provided as a storage medium of the SSD 1200. For example, the nonvolatile memory device 1230 may be provided as a NAND flash memory device with mass storage capability. The nonvolatile memory device 1230 may include a plurality of memory devices. In this case, the respective memory devices are connected to the SSD controller 1210 on a channel-by-channel basis. Although it has been described that the storage medium includes the nonvolatile memory device 1230 such as a NAND flash memory device, the storage medium may include other types of nonvolatile memory devices. For example, PRAM, MRAM, ReRAM, FRAM or NOR flash memory devices may be used as the storage medium, and a memory system with a hybrid of different types of memory devices may be applicable. Also, the storage medium may include volatile memory devices (e.g., DRAM devices).

Figure 17:
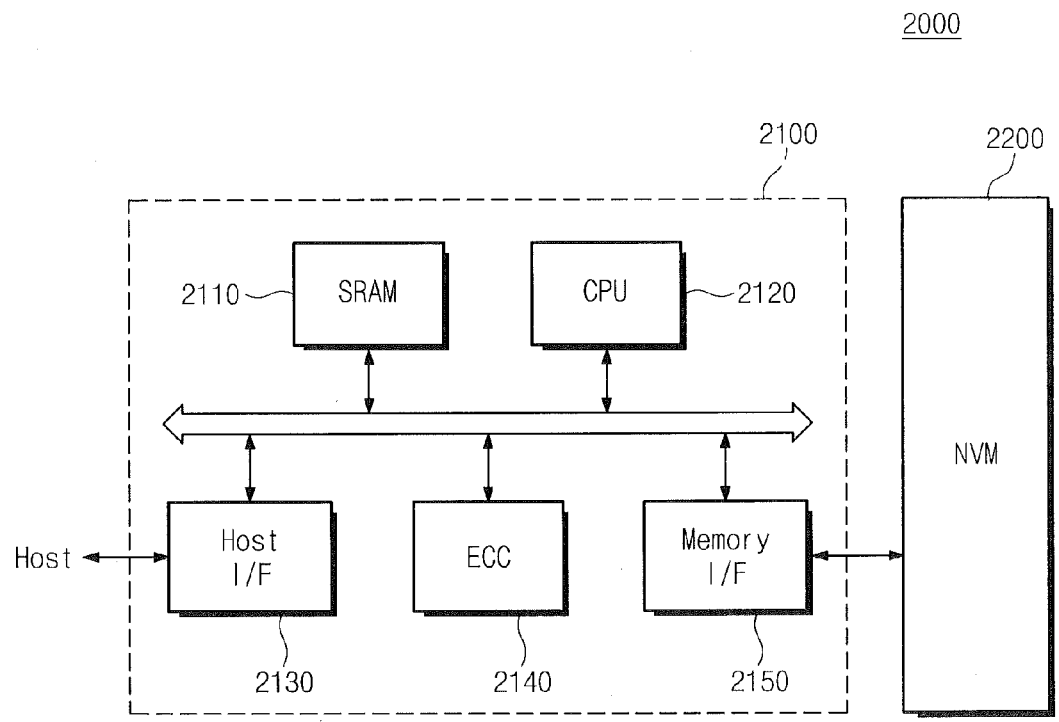
FIG. 17 is a block diagram of a memory system according to an exemplary embodiment of the inventive concept.

FIG. 17 is a block diagram of a memory system according to an exemplary embodiment of the inventive concept.

Referring to FIG. 17, a memory system 2000 according to an exemplary embodiment of the inventive concept includes a nonvolatile memory (NVM) device 2200 and a memory controller 2100.

A combination of the nonvolatile memory device 2200 and the memory controller 2100 may be provided as a memory card or a solid state disk (SSD). An SRAM 2110 is used as a working memory of a processing unit 2120. A host interface (I/F) 2130 has the data exchange protocol of a host connected to the memory system 2000. An error correction code (ECC) block 2140 detects/corrects an error in data read from the nonvolatile memory device 2200. A memory interface (I/F) 2150 interfaces with the nonvolatile memory device 2200. A processing unit 2120 performs an overall control operation for data exchange of the memory controller 2100.

Although not illustrated in FIG. 17, those skilled in the art will readily understand that the memory system 2000 may further include a ROM storing code data for interfacing with the host. The nonvolatile memory device 2200 may be provided as a multi-chip package including a plurality of flash memory chips. The memory system 2000 may be provided as a high-reliability storage medium with a low error probability. In particular, the flash memory device of the inventive concept may be provided in a memory system such as a solid state disk (SSD) that is under extensive research. In this case, the memory controller 2100 may be configured to communicate with an external device (e.g., the host) through one of various interface protocols such as USB, MMC, PCI-E, SAS, ATA, SATA, PATA, SCSI, and IDE.

Figure 18:
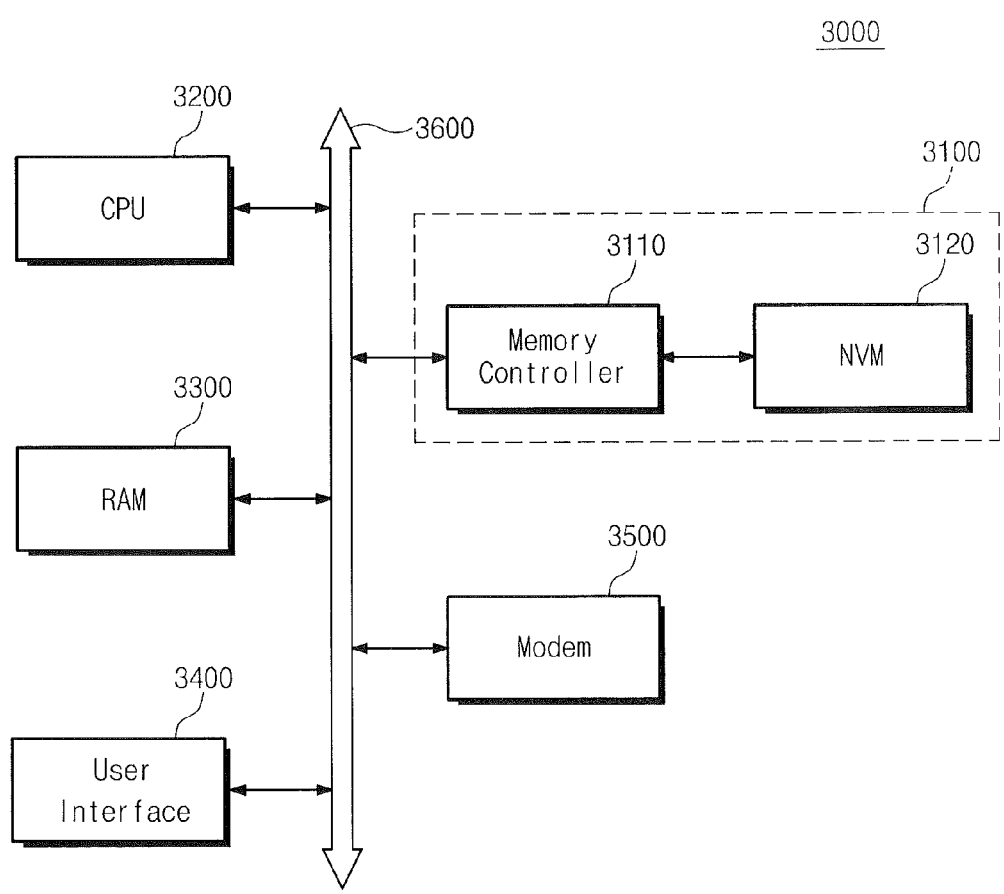
FIG. 18 is a block diagram of a computing system according to an exemplary embodiment of the inventive concept.

FIG. 18 is a block diagram of a computing system including a nonvolatile memory device according to an exemplary embodiment of the inventive concept.

Referring to FIG. 18, a computing system 3000 according to an exemplary embodiment of the inventive concept includes a microprocessor (i.e., CPU) 3200, a RAM 3300, a user interface 3400, a modem 3500 such as a baseband chipset, and a memory system 3100 that are electrically connected to a system bus 3600. The memory system 3100 may be configured in the same way as illustrated in FIG. 17. If the computing system 3000 is a mobile device, the computing system 3000 may further include a battery (not illustrated) for providing an operation voltage. Although not illustrated in FIG. 18, those skilled in the art will readily that the computing system 3000 may further include an application chipset, a camera image processor, and a mobile DRAM. For example, the memory system 3100 may constitute a solid state drive/disk (SSD) that uses a nonvolatile memory device to store data. Also, the memory system 3100 may be provided as a fusion flash memory device (e.g., a One-NAND flash memory device).

The nonvolatile memory device and/or the memory controller according to the inventive concept may be mounted in various types of packages. Examples of the packages of the nonvolatile memory device and/or the memory controller include Package on Package (PoP), Ball Grid Arrays (BGA), Chip Scale Packages (CSP), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP).

As described above, the use of the inventive concept can considerably increase the reliability of read data by providing an improved error correction capability. Also, the use of the inventive concept can increase the yield because even a memory device lacking a spare region for column redundancy can be used as a good product without being treated as a defective product.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A method of operating a memory device, comprising:
    identifying at least one weak string as weak column information; and
    performing an error correction operation on a first plurality of bits of data read from a plurality of strings of non-volatile memory cells using an algorithm that modifies a weighting of the reliability of one or more data bits in the first plurality of bits of data based on the weak column information, wherein said performing comprises performing an error correction operation on the first plurality of bits of data read from the plurality of strings using an algorithm that interprets a bit of data read from the at least one weak string as having a relatively reduced reliability relative to other ones of the first plurality of data bits.

2. The method of claim 1, further comprising testing the plurality of strings of nonvolatile memory cells in the memory device to identify at least one weak string therein having a higher probability of yielding erroneous read data error relative to other ones of the plurality of strings.

3. The method of claim 1, further comprising storing the identity of the at least one weak string as weak column information.

4. The method of claim 1, further comprising calculating a probability of error associated with each of the first plurality of bits of data.

5. The method of claim 1, further comprising calculating a probability of error associated with each of the first plurality of bits of data by determining a log-likelihood ratio (LLR) for each of the first plurality of bits of data.

6. The method of claim 1, wherein said performing comprises modifying a value of a bit of data read from the at least one weak string in advance of performing an error correction operation on the first plurality of bits of data.

7. A method for processing data read from a memory device, comprising:
    receiving weak column (WC) information of the memory device;
    calculating the probability of each of the bits of the data;
    modifying the probability of the bits, corresponding to the WC information, among the bits of the data; and
    performing an error correction operation on the basis of the modified probability, wherein in the calculating of the probability, the probability is a likelihood ratio (LR) or a log-likelihood ratio (LLR) for each of the bits of the data.

8. The method of claim 7, wherein the WC information includes an address of a defective column or a column with back pattern dependency, among the columns of the nonvolatile memory device.

9. The method of claim 7, wherein in the modifying of the probability of the bits corresponding to the WC information, the probability of the bits corresponding to the WC information is controlled to be smaller than the probability of normal bits.

10. The method of claim 7, wherein a soft decision decoding operation is performed in the performing of the error correction operation.

11. A method for processing data read from a memory device, comprising:
    receiving weak column (WC) information of the memory device;
    setting the bit, corresponding to a weak column, among the bits of the data to an erasure with reference to the WC information; and
    performing an error correction operation on the data, including the bit set to the erasure, according to an erasure decoding scheme, wherein the performing of the error correction operation comprises:
    a first decoding operation of substituting a logic '0' for an erasure bit of the data including the erasure and performing an error correction operation; and a second decoding operation of substituting a logic '1' for the erasure bit of the data including the erasure and performing an error correction operation.

12. The method of claim 11, wherein in the setting of the bit to erasure, the WC information is provided as location information of the erasure.

13. The method of claim 11, further comprising selecting the output data of the operation, which is treated as a decoding success, among the first decoding operation and the second decoding operation, as the final read data.

14. The method of claim 11, wherein the performing of the error correction operation further comprises:
generating a plurality of candidate data by substituting a combination of a logic '0' or a logic '1' for the erasure bit of the data including the erasure; and
performing the error correction operation on the candidate data.

15. The method of claim 14, further comprising selecting the output data, treated as a decoding success, among the candidate data as the final read data.

16. The method of claim 14, further comprising selecting one of the candidate data as the final output data if there are at least two candidate data treated as a decoding success by the error correction operation.

17. A memory system comprising:
a memory device; and
a memory controller determining each of the bits of read data, received from the memory device, according to a soft decision decoding scheme with reference to weak column (WC) information,
wherein a weight different from a normal bit is applied to the bit, corresponding to the WC information, among the bits of the read data in the soft decision decoding scheme, wherein the memory controller comprises:
a WC management unit setting a weak column of the read data with reference to the WC information; and
a soft decision decoder determining each of the bits of the read data according to the maximum likelihood criterion with reference to the WC information.

18. The memory system of claim 17, wherein the soft decision decoder comprises:
a likelihood ratio (LR) calculation unit calculating a probability value of each of the bits of the read data; and
an error correction decoder correcting the probability value with reference to the WC information and correcting an error in the read data with reference to the corrected probability value.

19. The memory system of claim 18, wherein the soft decision decoder further comprises an a posteriori probability unit calculating an a posteriori probability of the bits of the read data,
wherein the probability value includes a likelihood ratio (LR) or a log-likelihood ratio (LLR).

20. The memory system of claim 17, wherein the WC information is stored and updated in a predetermined region of the nonvolatile memory device.

21. The memory system of claim 17, wherein the WC information is stored and updated in a memory device of the memory controller.

22. The memory system of claim 17, wherein the WC information is detected in a merge operation or a test process of the nonvolatile memory device and is stored in the nonvolatile memory device.

23. The memory system of claim 17, wherein the nonvolatile memory device is a three-dimensional semiconductor memory device comprising vertical strings.

* * * * *